(12) United States Patent
Banin et al.

(10) Patent No.: US 11,095,427 B1
(45) Date of Patent: Aug. 17, 2021

(54) TRANSCEIVER WITH INSEPARABLE MODULATOR DEMODULATOR CIRCUITS

(71) Applicant: Intel Corporation, Santa Clara, CA (US)

(72) Inventors: Rotem Banin, Even-Yehuda (IL); Elan Banin, Raanana M (IL); Ofir Degani, Nes-Ammim (IL); Ronen Gernizky, Zichron Yaakov (IL); Ashoke Ravi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/033,059

(22) Filed: Sep. 25, 2020

(51) Int. Cl.
*H04L 7/033* (2006.01)
*H04B 1/403* (2015.01)

(52) U.S. Cl.
CPC ............ *H04L 7/033* (2013.01); *H04B 1/403* (2013.01)

(58) Field of Classification Search
CPC ..... H03L 2207/50; H04B 1/00; H04B 1/0475; H04B 1/123; H04B 1/04; H04L 7/0331; H04L 7/0016; H04L 7/0037; H04L 7/0045; H04L 7/0054; H04L 7/04
See application file for complete search history.

(56) References Cited

U.S. PATENT DOCUMENTS

| | | | |
|---|---|---|---|
| 9,791,834 B1* | 10/2017 | Nassar | G04F 10/005 |
| 2013/0254632 A1* | 9/2013 | Miyashita | G06F 11/1008 |
| | | | 714/776 |
| 2015/0074028 A1* | 3/2015 | Miyashita | G06N 3/0635 |
| | | | 706/25 |
| 2016/0191084 A1* | 6/2016 | Kim | H04L 7/04 |
| | | | 375/295 |
| 2017/0322520 A1* | 11/2017 | Wu | H03M 1/50 |
| 2017/0329284 A1* | 11/2017 | Wu | H03M 3/414 |
| 2020/0212943 A1* | 7/2020 | Banin | H04L 25/49 |

* cited by examiner

*Primary Examiner* — Khanh C Tran
(74) *Attorney, Agent, or Firm* — Schiff Hardin LLP

(57) ABSTRACT

A transceiver, including a modulation circuit configured to modulate a first digital word into a first modulated time signal; and a demodulation circuit configured to demodulate a second modulated time signal into a second digital word, wherein the modulation and demodulation circuits are operable without an external clock source, and inseparably share one or more same circuit elements. Also, a tunable delay line may be configured to set a time rate of the modulation, wherein the modulation circuit and the demodulation circuit inseparably share the tunable delay line.

22 Claims, 5 Drawing Sheets

FIG 4A1

400A1
XOR gate for interleaving transceivers

FIG 4A2

400A2
Signal diagrams for XOR gate out = (falling edge of In1) + (rising edge of In2)

500
transceiving method

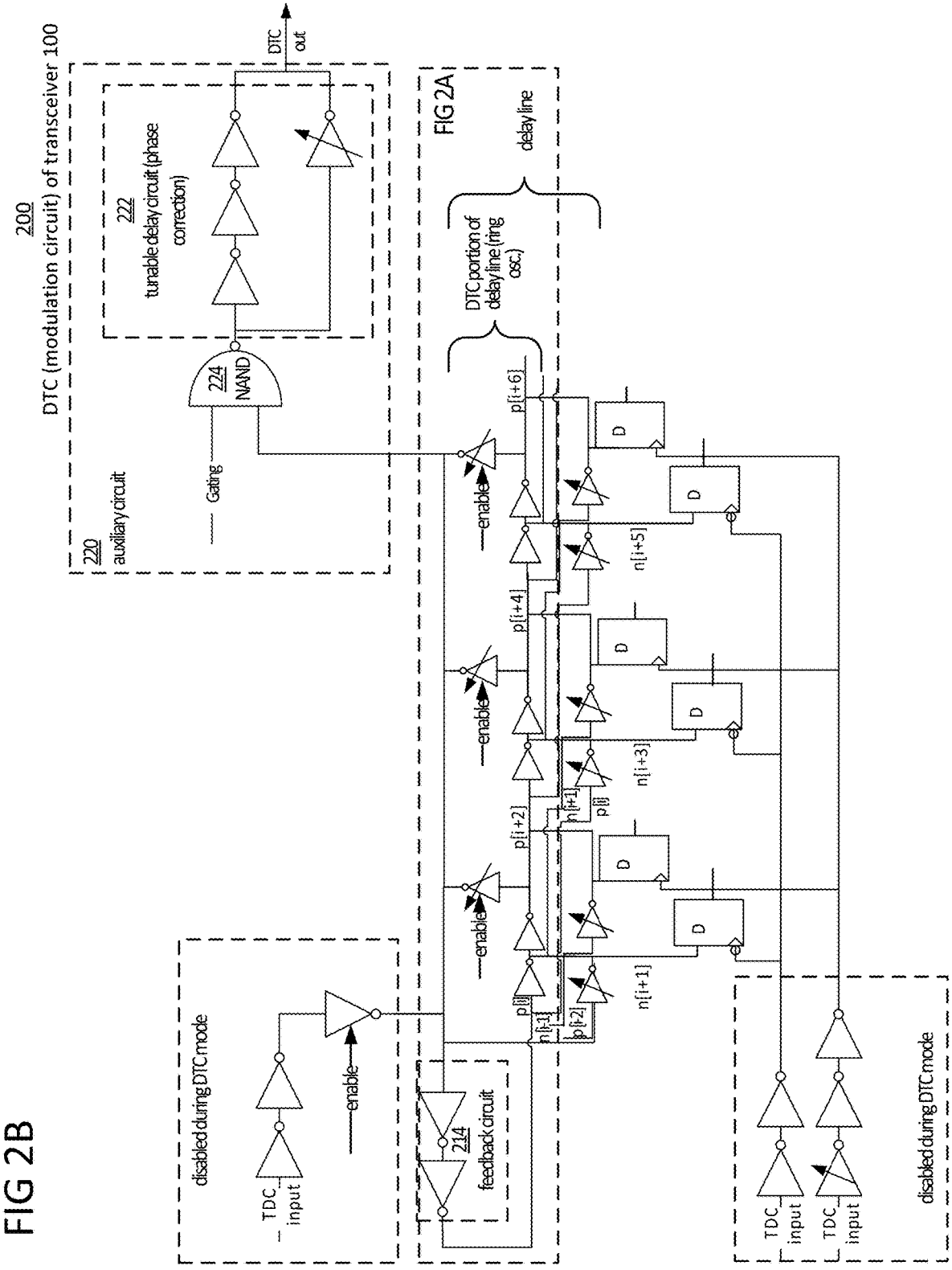

US 11,095,427 B1

TRANSCEIVER WITH INSEPARABLE MODULATOR DEMODULATOR CIRCUITS

BACKGROUND

Serial Time Encoded Phy (STEP) is a serial interface technology that modulates data based on pulse time length. A modulation circuit modulates data into a modulated time signal using a PLL as a clock frequency source. A demodulation circuit demodulates the modulated time signal by measuring a time length of each pulse; the demodulation circuit does not require the clock frequency.

Current transceivers have separate modulation and demodulation circuits, along with a separate Phase-Locked Loop (PLL) as a clock source for the modulation circuit. This configuration requires significant area and power leading to higher shoreline. Also, the PLL's relatively-long lock time results in reduced effectiveness during a low-power state, and increased time required to reverse channel direction.

BRIEF DESCRIPTION OF THE DRAWINGS

FIG. 2B illustrates a DTC of the transceiver of FIG. 1 in accordance with aspects of the disclosure.

FIG. 3A1 illustrates a portion of a Time-to-Digital Converter (TDC) in accordance with aspects of the disclosure.

FIG. 3A2 illustrates signal diagrams for the portion of the TDC of FIG. 3A1 in accordance with aspects of the disclosure.

FIG. 4A1 illustrates an XOR gate for interleaving transceivers of FIG. 1 in accordance with aspects of the disclosure.

FIG. 4A2 illustrates signal diagrams for the XOR gate of FIG. 4A1 in accordance with aspects of the disclosure.

DESCRIPTION OF THE ASPECTS

The present disclosure is directed to a transceiver having modulation and demodulation circuits (DTC and TDC, respectively) that are operable without an external clock source, such as a Phase-Locked Loop (PLL), and inseparably share one or more same circuit elements. A single circuit replaces three circuits (PLL, DTC, and TDC). A single delay line may be coupled as a ring oscillator to be used by both the modulation and demodulation circuits.

Figure 1:
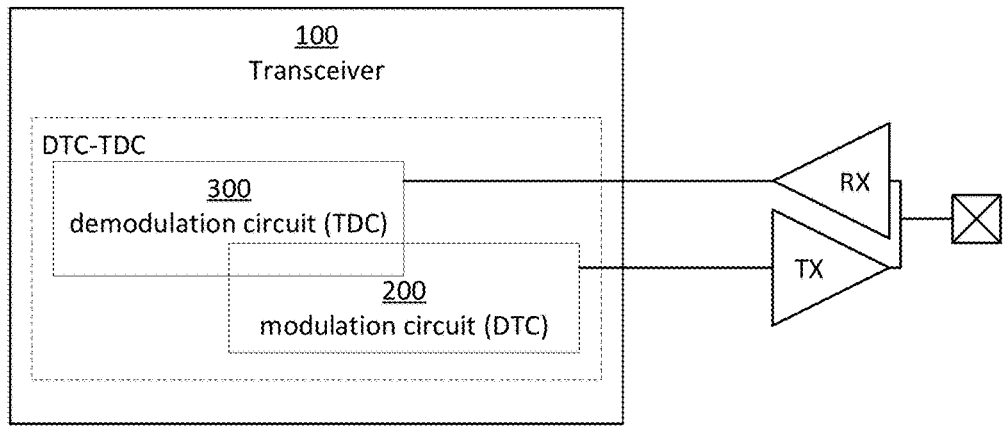
FIG. 1 illustrates a transceiver in accordance with aspects of the disclosure.
Figure 1:
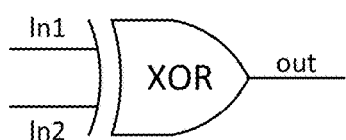
Figure 1:
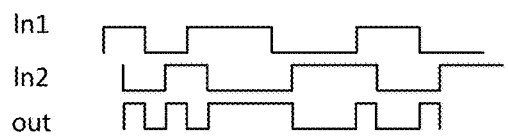

FIG. 1 illustrates a transceiver 100 in accordance with aspects of the disclosure.

The transceiver 100 comprises a modulation circuit 200 and a demodulation circuit 300. The modulation circuit 200 is configured to modulate a digital word into a modulated time signal to be transmitted. The demodulation circuit 300 is configured to demodulate a received modulated time signal into a digital word. The modulation circuit 200 and demodulation circuit 300 are operable without an external clock source. Also, the modulation circuit 200 and demodulation circuit 300 inseparably share one or more same circuit elements.

The transceiver (DTC-TDC) circuit may be incorporated as part of a transmission channel, as part of a reception channel, or as part of a bi-directional channel. A transmission (TX) buffer and a reception buffer (RX) are shown coupled between the transceiver 100 and a shared pad. Only one of the modulator (DTC) and demodulator (TDC) operates at a time. The "DTC-TDC" box represents the modulator (DTC) and demodulator (TDC) combination.

The modulation circuit 200 may be a Digital-to-Time Converter (DTC). The demodulation circuit 300 may be a Time-to-Digital Converter (TDC). DTCs and TDCs are a family of converters designed to modulate and demodulate digital information in the time domain. This disclosure is not limited to the modulation and demodulation circuits being a DTC and TDC, respectively, but may be other circuit types as applicable.

The transceiver 100 has two modes—Digital-to-Time Conversion (DTC), which is described with reference to FIGS. 2A and 2B, and Time-to-Digital Conversion (TDC), which is described with reference with FIGS. 3A1, 3A2, and 3B. FIGS. 4A1, 4A2, 4B, and 5 relates to both modes.

Figure 2A:
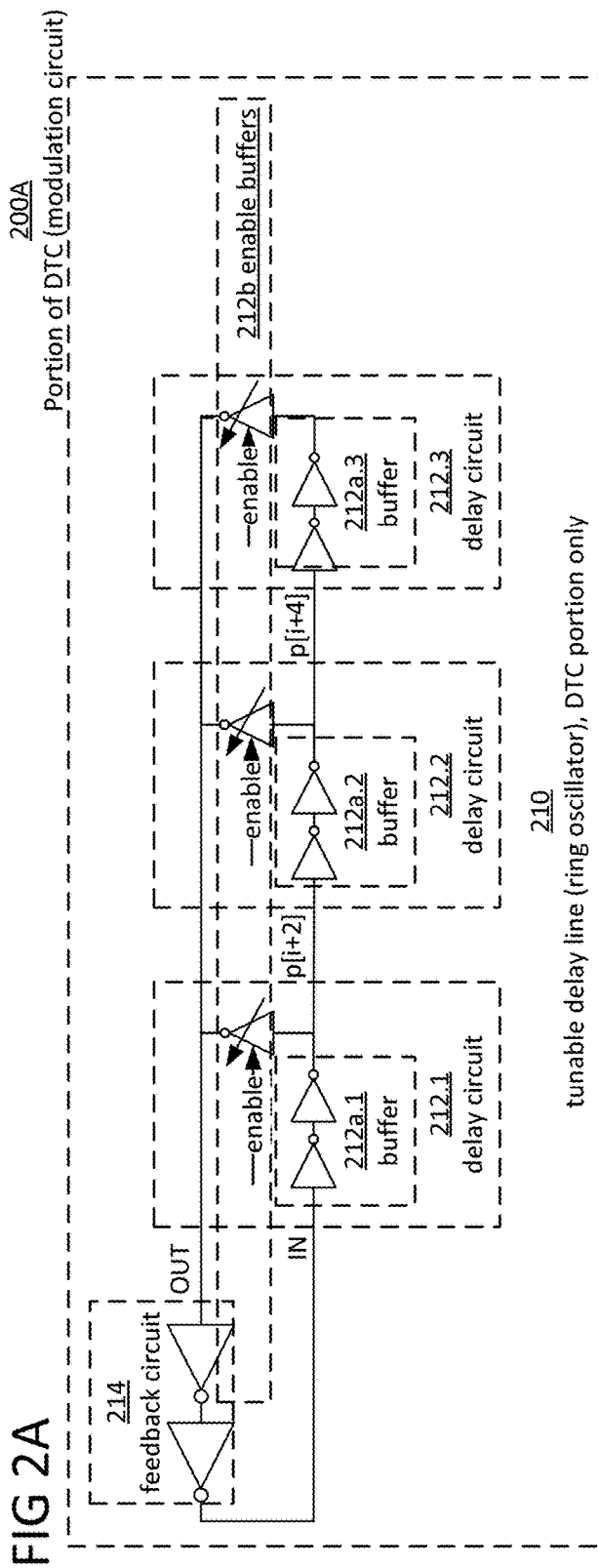
FIG. 2A illustrates a portion of a Digital-to-Time Converter (DTC) in accordance with aspects of the disclosure.

FIG. 2A illustrates a portion of a Digital-to-Time Converter (DTC) 200A in accordance with aspects of the disclosure. A portion of the DTC 200A is explained to enable a better understanding of the operation of the full DTC 200.

Generally, a DTC is configured to generate modulate a digital word into a modulated time signal to be transmitted, wherein a signal edge location (pulse length) depends on the digital word. A TDC, on the other hand as described further below, is configured to demodulate a received modulated time signal into a digital word that describes the timing of the received time signal edges (pulse length).

The DTC 200A comprises a tunable delay line 210 (only DTC portion of delay line is shown) including a plurality of cascade-connected delay circuits 212 (three, 212.1, 212.2, and 212.3, in the example of FIG. 2A) formed in a ring. Each delay circuit 212 includes a buffer 212a and an enable buffer 212b. Each buffer 212a comprises two inverters. The enable buffer 212b acts as a switch, and is also an inverter. Each delay circuit 212 generates a delay signal by delaying an input signal by a unit delay time.

In DTC mode generally, each delay circuit 212 can be programmed (within a range) to produce a delay. The DTC 200 modulates a received digital word into a corresponding modulated time signal by enabling one of the cascade-connected delay circuits 212, and then an input of the tunable delay line is a feedback signal from the enabled delay circuit 212. The DTC 200 modulates a digital word into a timing signal by selecting different taps of the delay line 210 for the feedback. Each additional delay circuit 212 makes the feedback signal pulse longer. The feedback signal passes through the feedback circuit 214, which in this example comprises two serial-connected inverters.

More specifically, multiple enable buffers 212b are connected to a shared output, where only one of the enable buffers 212b is enabled. For each pulse that propagates through the delay line, only one of the enable buffers 212b drives the pulse back into the beginning of the delay line, thereby closing the loop to form a ring oscillator and eliminating the need for a PLL (external clock source). The ring oscillator is a modulated ring oscillator because the feedback point/tap for the ring oscillator can vary for every signal pulse edge. The ring oscillator thus does not run at a fixed frequency; the frequency is changed by selecting different taps in the delay line, therefore generating pulses of different time lengths.

Each feedback loop has five inverters (alternatively there could be seven, nine, etc.) to form a ring oscillator with different cycle time or pulse lengths. Optionally, a different delay circuit 212 could be enabled for every pulse (half cycle).

For example, when the digital word is 1, the first delay circuit 212.1 may be enabled via its respective enable buffer 212*b*. Consequently, DTC 200 converts the digital word to a time signal that is a shortest length. Conversely, when the digital word is 4, the fourth delay circuit 212.4 is enabled via its respective enable buffer 212*b*. Consequently, DTC 200 converts the digital word to a time signal of that is a longest length. The remaining cases in which digital word is 3 or 4 are converted in the same manner. In this way, DTC 200 converts the digital word into a time signal where the time length of the pulse is proportional to the value of digital word.

FIG. 2B illustrates a full DTC 200 of the transceiver of FIG. 1 in accordance with aspects of the disclosure. The portion of the DTC 200A of FIG. 2A is shown, along with an auxiliary circuit 220, in context with the rest of the transceiver 100. The grayed portions of the circuit are disabled during the DTC mode, and are instead part of the demodulator (TDC), which is enabled during the TDC mode. Some details of the portion of the DTC 200A of FIG. 2A are not shown in FIG. 2B so as to not unnecessarily crowd the figure.

The auxiliary circuit 220 is coupled to the delay line, and is configured to correct phase by delaying the modulated time signal without accumulating additional delay in the tunable delay line. The auxiliary circuit 220 comprises a tunable delay circuit 222 that comprises two branches, one branch with three inverters (in this example) coupled in series, and a parallel branch with a tunable delay element. The DTC output signal is an average of the two branch phases (time difference). Adjusting the ratio adjusts the delay without changing the frequency of the ring oscillator.

The auxiliary circuit 220 may be coupled to any point in the delay line of the DTC output, although in this example is coupled to the shared feedback node.

The auxiliary circuit 220 is used to provide a pre-distortion to compensate for known distortions in a transmission channel. The signal received at a receiver will then be closer to the ideal signal form. Also, if the delay of one of the stages inside the ring oscillator has an error, this error will accumulate over time. The auxiliary circuit 220 may apply a correction delay to a pulse edge outside the ring oscillator loop; this correction delay is adjustable for each pulse edge.

The auxiliary circuit 220 may also comprise a logical gate, such as NAND gate 224, that is configured to gate (block) the modulated time signal at the DTC output by permitting the modulated time signal to combine to a longer pulse length for more than one cycle of the tunable delay line. If the gating signal is 0, the NAND gate 224 forces a constant logical 1 at the output regardless of the other NAND input. If a pulse that is longer than the delay line is desired, then gating the DTC output allows multiple cycles of the ring oscillator to pass before the DTC output transmission is resumed.

Figure 2A:
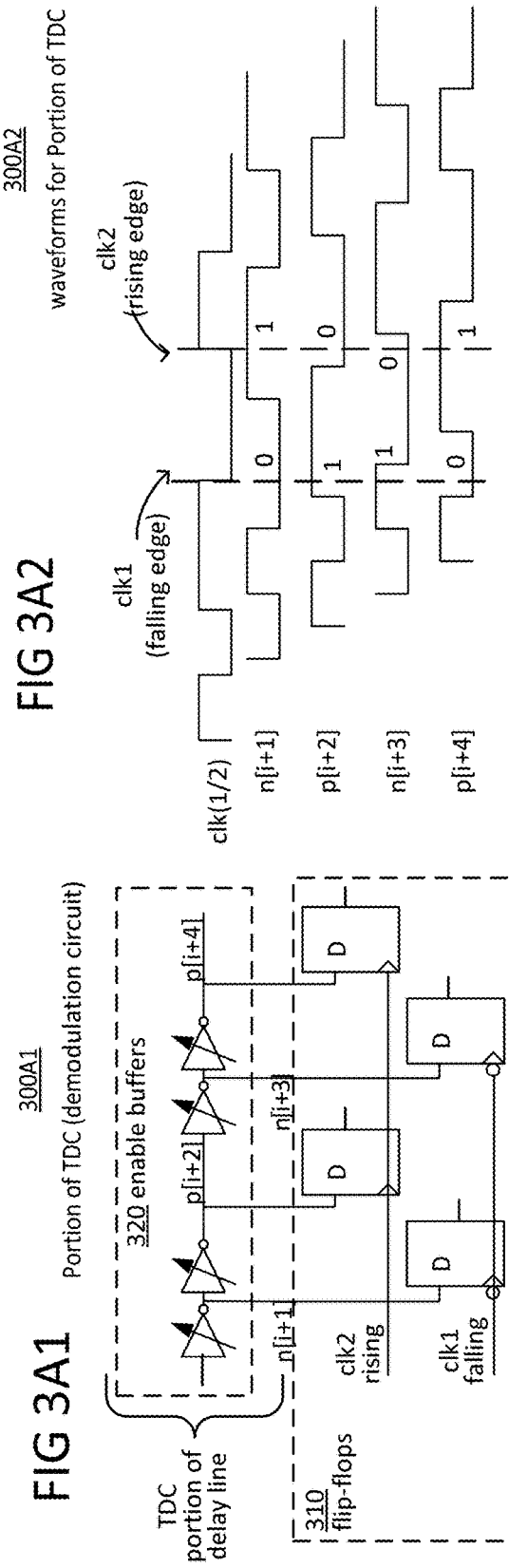

FIG. 3A1 illustrates a portion of a Time-to-Digital Converter (TDC) 300 in accordance with aspects of the disclosure. FIG. 3A2 illustrates signal diagrams for the portion of the TDC of FIG. 3A1 in accordance with aspects of the disclosure. A portion of the TDC 300A is explained to enable a better understanding of the operation of the full TDC 300.

Generally, a TDC is configured to demodulate a received modulated time signal into a digital word that describes the timing of the received time signal edges.

The TDC 300A1 comprises flips-flips 310 and enable buffers 320. Only two stages are shown for the sake of simplicity.

In TDC mode, the enabled portions of the transceiver 100 are the tunable delay line and flip-flops 310. The tunable delay line comprises enable buffers 320. The flip-flops 310 sample the state of the delay line for each pulse edge. The TDC input is driven by an external modulated time signal, rather than the feedback signal as in the DTC mode discussed above.

The flip-flops 310 are divided into two groups—one flip-flip group samples modulated time signal pulses on the rising edges, and the other samples on the falling edges. The two flip-flop groups 310 are offset in the delay line by one delay element. The same input modulated time signal drives the delay line enable buffers 320 and the flip-flop clock inputs clk1, clk2 so that the time difference (delay) between the clock and modulated data is the same.

The flip-flips 310 sample-and-hold data from the delay line, and then before the next sample-and-hold action decode this data based on the pulse length. The flip-flops 310 all sample at the same time. A rising/falling pulse edge of the modulated data signal takes time to propagate through the delay line. If there is a propagating rising edge, the flip-flops 310 sample logical 1s, and after the falling edge sample logical 0s (e.g., 0111). A digital processor that receives the sampled data from the flip-flops 310 can deduce that the rising edge occurred three time delays prior.

The data output from the flip-flops 310 is transmitted to the digital processor (priority encoder) where it is decoded to extract the length of the pulses. The length of the data is determined by the number of TDC stages. A TDC 300 with four flip-flops 310, that is, two flip-flops sampling rising edges and two flip-flops sampling falling edges, demodulates two bits. The modulated time signal encodes information based on pulse length. A short pulse might be 00, a long pulse 11, and a pulse length between would be 01. Each clock cycle represents multiple bits. If there are four flip-flops 310, then each clock cycle represents two bits, or four possible data values.

FIG. 3A2 shows a clock clk1/clk2 signal in the uppermost waveform. The clock signals clk1 and clk 2 represent the data. The two signals clk1 and clk2 are the same signal, but clk2 triggers flip-flips 310 to sample at pulse rising edges, and clk1 triggers flip-flops 310 to sample at pulse falling edges. Also, this same clk1/clk2 signal is the signal that propagates through the delay line. Signals n[i+1], p[i+2], n[i+3], and p[i+4] shown are delayed versions of the clk1/2 signal.

By way of example with reference to FIG. 3A2, at a time represented by the clk1 dashed line, the corresponding clk1 flip-flops 310 sample and hold states of the delay line at falling edges of the CLK signal. Signal p[i+2] has a logical 1 value, which means the pulse did not have time to switch down, meaning the incoming pulse is longer than the delay at signal p[i+2]. But at signal p[i+4], the signal has logical 0, meaning the incoming pulse is shorter than the delay at signal p[i+4]. The flip-flips 310 determine whether the pulse was longer or shorter, and this information is used by the digital processor to decode the value of the received modulated data represented by the pulse length. The modulated data signal continues to flow through the delay line, and the flip-flops 310 continue to sample at every edge to output from flip-flops 310 a digital data stream.

Figure 3B:
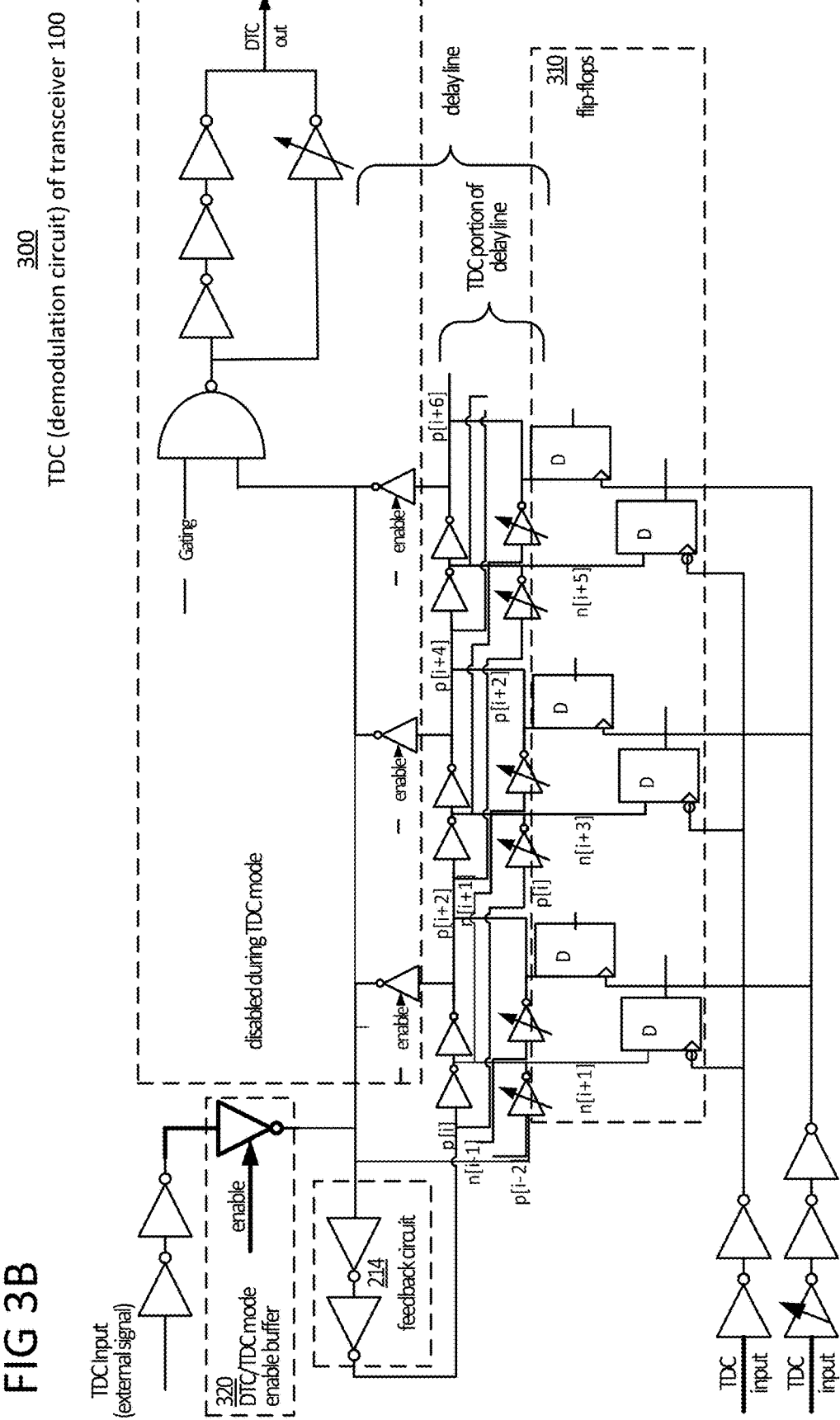
FIG. 3B illustrates a TDC of the transceiver of FIG. 1 in accordance with aspects of the disclosure.

FIG. 3B illustrates a full TDC of the transceiver of FIG. 1 in accordance with aspects of the disclosure. Some of the details of FIG. 3A1 are not shown so as to not unnecessarily crowd the figure.

The feedback circuit 214, which is also shown in FIG. 2A, comprises two inverters for the feedback signal of the ring oscillator. The feedback circuit 214 sets the minimum delay between the clock and first flip-flop 310.

The DTC/TDC mode enable buffer 330 is coupled to an input of the TDC 300, and is configured to enable the transceiver 100 to operate in either the DTC (modulation) mode or the TDC (demodulation) mode. The two inverters serial connected to the mode enable buffer 330 are merely a buffer delay.

The TDC inputs shown in the lower left-hand corner of the circuit are also just buffer delays. One buffer delay is adjustable to add an extra delay to account for the timing difference between the flip-flops sampling rising edges and the flip-flops sampling falling edges.

FIG. 4A1 illustrates an XOR gate 400A1 for interleaving two transceivers 100 of FIG. 1, and FIG. 4A2 illustrates corresponding signal diagrams 400A2, in accordance with aspects of the disclosure.

Transceivers 100 can be interleaved to double the data rate of modulation and demodulation. The XOR gate 400A1 receives a first signal In1 from a first transceiver at a first input, and a second signal Int from a second transceiver at a second input. The first signal In1 and the second signal Int are the same, but the second signal Int is delayed with respect to the first signal In1. The XOR gate 400A1 outputs a signal that is double the frequency relative to one of the input signals In1, Int. FIG. 4A2 shows that the XOR gate 400A1 outputs the rising edges of the first signal In1, and collates into the output signal the falling edges of the second signal Int.

Figure 4B:
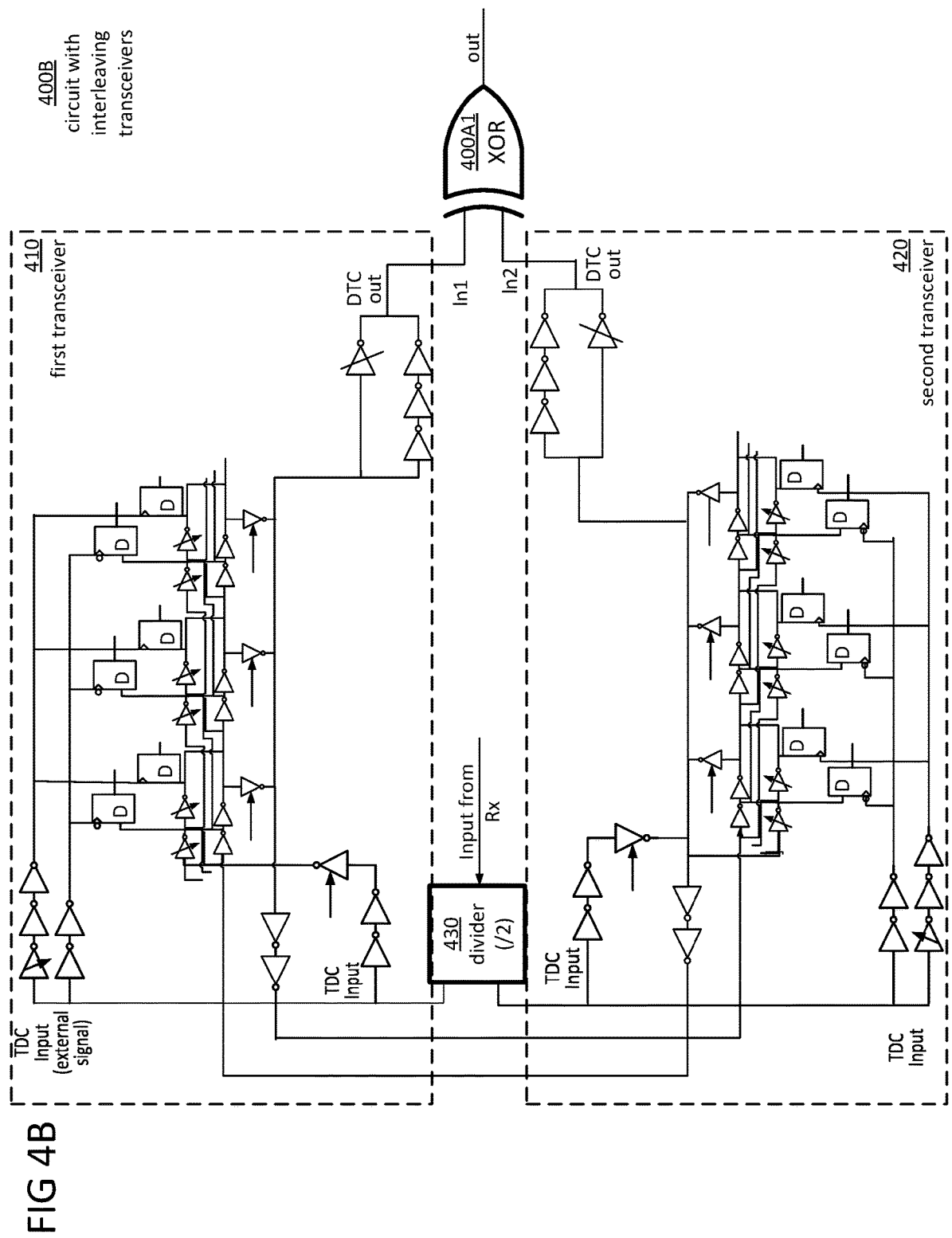
FIG. 4B illustrates a circuit with interleaving transceivers of FIG. 1 in accordance with aspects of the disclosure.

FIG. 4B illustrates a circuit 400B with interleaving transceivers 100 of FIG. 1 in accordance with aspects of the disclosure.

The XOR gate 400A1 comprises a first input In1 and a second input Int. The first input In1 receives the DTC output of a first transceiver 410, and the second input Int receives the DTC output of a second transceiver 420. The XOR gate 400A1 interleaves the DTC output of the first transceiver 410 and the DTC output of the second transceiver 420.

In DTC mode, the two delay lines of the first and second transceivers 410, 420, respectively, are connected in a figure "8" so that a feedback signal of a delay line of one transceiver drives a delay line of the other transceiver. Instead of one delay line forming a ring with the DTC output going back to the same delay line, the DTC output instead goes to the input of the other delay line. Also, the DTC outputs of the two delay lines, which are the same signal but offset with respect to one another, are interleaved by being input to the XOR gate 400A1 to double the frequency.

After a pulse edge passes through the first (upper) transceiver 410, the XOR output subsequently reverses its logical state as the same pulse edge propagates though the second (lower) transceiver 420. The first (upper) transceiver 410 generates rising edges of the XOR output, while the second (lower) transceiver 420 generates falling edges of the XOR output, thereby doubling the signal rate.

Assume the initial digital word is a logical 0, and that one of the delay circuits 212 of one of the DTCs 200 is selected to start propagating a logical 1. This logical 1 input to the XOR gate 400A1 changes the XOR output state to logical 1. This logical 1 then propagates through the other DTC 200. This same logical 1 is fed back to the other DTC 200, and the two XOR inputs become equal again, changing the XOR output to logical 0. Thus one delay line sets the length of the logical 1 output until a following pulse edge.

A divider circuit 430, which is used for TDC mode, is configured to divide a received modulated time signal into the modulated time signal input of the first transceiver 410 and the modulated time signal of the second transceiver 420. The divider circuit 430 comprises a first output coupled to an input of the TDC 300 of the first transceiver 410, and a second output coupled to an input of the TDC 300 of the second transceiver 420. The first transceiver 410 is configured to be synchronous with rising edges of the received modulated time signal, and the second transceiver 420 is configured to be synchronous with falling edges of the received modulated time signal, restoring the original modulated signal. In the TDC mode there is no feedback between the two transceivers 410, 420.

Figure 5:
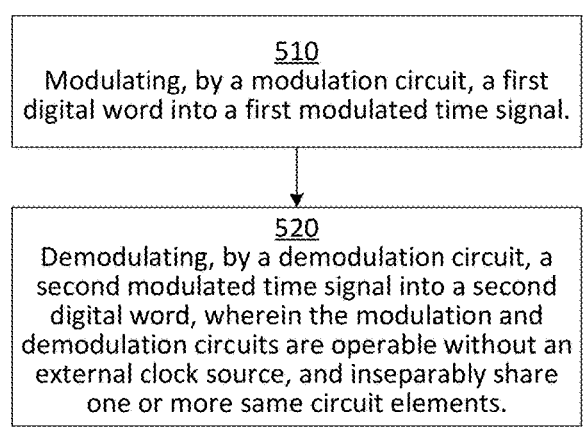
FIG. 5 illustrates a flowchart of a transceiving method in accordance with aspects of the disclosure.

FIG. 5 illustrates a flowchart 500 of a transceiving method in accordance with aspects of the disclosure.

At Step 510, a modulation circuit 200 modulates a first digital word into a first modulated time signal.

At Step 520, a demodulation circuit 300 demodulates a second modulated time signal into a second digital word. The modulation circuit 200 and demodulation circuit 300 are operable without an external clock source, and are inseparably share one or more same circuit elements.

The transceiver having an inseparable modulator/demodulator circuit provides an opportunity to have a reversible/programmable channel direction, offering system flexibility and lower complexity. The same circuit can be used as receiver or a transmitter. Also, there is no need for clock distribution. The result is lower area requirements and higher throughput. And the transceiver offers future scalability by interleaving two transceiver circuits to double the data rate.

The transceiver and the transceiving method disclosed herein are beneficial in that they have improved performance with respect to area, shoreline length, power, latency. Removing the PLL saves power and reduces wake up latency to a few data cycles.

The transceiver disclosed herein may be implemented in any communication device, such as a mobile device as a mobile transceiver or a base station as a base station transceiver in a mobile communication system. The mobile communication system may correspond, for example, to one of the Third Generation Partnership Project (3GPP)-standardized mobile communication networks, where the term mobile communication system is used synonymously to mobile communication network. The mobile or wireless communication system may correspond to a mobile communication system of the 5th Generation (5G) and may use mm-Wave technology. The mobile communication system may correspond to or comprise, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

A base station transceiver may be operable or configured to communicate with one or more active mobile transceivers. A base station transceiver can be located in or adjacent to a coverage area of another base station transceiver, e.g. a macro cell base station transceiver or small cell base station transceiver. Hence, examples may provide a mobile communication system comprising one or more mobile transceivers and one or more base station transceivers, wherein the base station transceivers may establish macro cells or small cells, as e.g. pico-, metro-, or femto cells. A mobile transceiver may correspond to a smartphone, a cell phone, User Equipment (UE), a laptop, a notebook, a personal computer, a Personal Digital Assistant (PDA), a Universal Serial Bus (USB)-stick, a car, etc. A mobile transceiver may also be referred to as UE or mobile in line with the 3 GPP terminology. A base station transceiver can be located in the fixed or stationary part of the network or system. A base station transceiver may correspond to a remote radio head, a transmission point, a relay station, an access point, a macro cell, a small cell, a micro cell, a femto cell, a metro cell etc. A base station transceiver can be a wireless interface of a wired network, which enables transmission of radio signals to a UE or mobile transceiver. Such a radio signal may comply with radio signals as, for example, standardized by 3GPP or, generally, in line with one or more of the above listed systems. Thus, a base station transceiver may correspond to a NodeB, an eNodeB, a Base Transceiver Station (BTS), an access point, a remote radio head, a transmission point, a relay station etc., which may be further subdivided in a remote unit and a central unit.

The techniques of this disclosure may also be described in the following examples.

Example 1. A transceiver, comprising: a modulation circuit configured to modulate a first digital word into a first modulated time signal; and a demodulation circuit configured to demodulate a second modulated time signal into a second digital word, wherein the modulation and demodulation circuits are operable without an external clock source, and inseparably share one or more same circuit elements.

Example 2. The transceiver of example 1, further comprising: a tunable delay line configured to set a time rate of the modulation, wherein the modulation circuit and the demodulation circuit inseparably share the tunable delay line.

Example 3. The transceiver of example 2, further comprising: an auxiliary circuit coupled to the tunable delay line, and configured to delay the first modulated time signal without accumulating additional delay in the tunable delay line.

Example 4. The transceiver of example 3, wherein the auxiliary circuit comprises a logical gate configured to gate the first modulated time signal to combine the first modulated time signal for more than one cycle of the tunable delay line.

Example 5. The transceiver of example 1, further comprising: a tunable delay line comprising cascade-connected delay circuits formed in a ring, wherein the modulation circuit is configured to modulate the first digital word into the corresponding first modulated time signal by enabling one of the cascade-connected delay circuits, and an input of the tunable delay line is a feedback signal from the enabled delay circuit.

Example 6. The transceiver of example 1, wherein the modulation circuit is a Digital-to-Time Converter (DTC).

Example 7. The transceiver of example 1, wherein the demodulation circuit is a Time-to-Digital Converter (TDC).

Example 8. The transceiver of example 1, wherein the tunable delay line comprises a ring oscillator.

Example 9. The transceiver of example 1, further comprising: a mode buffer coupled to an input of the demodulator circuit, and configured to enable the transceiver to operate in a modulation mode or a demodulation mode.

Example 10. A circuit, comprising: a first transceiver as claimed in example 1; a second transceiver as claimed in example 1; and an XOR gate comprises a first input coupled to an output of the modulator of the first transceiver, a second input coupled to an output of the modulator of the second transceiver, and configured to interleave the first modulated time signal of the first transceiver and the first modulated time signal of the second transceiver.

Example 11. The transceiver of example 1, wherein the modulation circuit is a Serial Time Encoded Phy (STEP) modulation circuit, and the demodulation circuit is a STEP demodulation circuit.

Example 12. A circuit, comprising: a first transceiver as claimed in example 1; a second transceiver as claimed in example 1; and a divider circuit comprising a first output coupled to an input of the demodulator of the first transceiver, and a second output coupled to an input of the demodulator of the second transceiver, and configured to divide a received modulated time signal into the second modulated time signal of the first transceiver and the second modulated time signal of the second transceiver.

Example 13. The circuit of example 12, wherein the first transceiver is configured to be synchronous with rising edges of the received modulated time signal, and the second transceiver is configured to be synchronous with falling edges of the received modulated time signal.

Example 14. A transceiving method, comprising: modulating, by a modulation circuit, a first digital word into a first modulated time signal; and demodulating, by a demodulation circuit, a second modulated time signal into a second digital word, wherein the modulation and demodulation circuits are operable without an external clock source, and inseparably share one or more same circuit elements.

Example 15. The transceiving method of example 14, further comprising: setting, by a tunable delay line, a time rate of the modulation, wherein the modulation circuit and the demodulation circuit inseparably share the tunable delay line.

Example 16. The transceiving method of example 15, further comprising: delaying, by an auxiliary circuit coupled to the tunable delay line, the first modulated time signal without accumulating additional delay in the tunable delay line.

Example 17. The transceiving method of example 16, further comprising: gating, by a logical gate of the auxiliary circuit, the first modulated time signal to combine the first modulated time signal for more than one cycle of the tunable delay line.

Example 18. The transceiving method of example 14, wherein a tunable delay line comprising cascade-connected delay circuits formed in a ring, and further comprising: modulating, by the modulation circuit, the first digital word into the corresponding first modulated time signal by enabling one of the cascade-connected delay circuits; and feeding back from the enabled delay circuit a feedback signal as an input of the tunable delay line.

Example 19. The transceiving method of example 14, wherein the modulation circuit is a Digital-to-Time Converter (DTC).

Example 20. The transceiving method of example 14, wherein the demodulation circuit is a Time-to-Digital Converter (TDC).

Example 21. The transceiving method of example 14, wherein the tunable delay line comprises a ring oscillator.

Example 22. The transceiving method of example 1, further comprising: enabling, by a mode buffer coupled to an input of the demodulator circuit, and the transceiver to operate in a modulation mode or a demodulation mode.

Example 23. The transceiving method of example 14, further comprising: interleaving the first modulated time signal of a transceiver with another modulated time signal of another transceiver.

Example 24. The transceiving method of example 14, further comprising: dividing a received modulated time signal into the second modulated time signal of a first transceiver and another modulated time signal of another transceiver.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A transceiver, comprising:
a modulation circuit configured to modulate a first digital word into a first modulated time signal;
a tunable delay line configured to set a time rate of the modulation; and
a demodulation circuit configured to demodulate a second modulated time signal into a second digital word,
wherein the modulation and demodulation circuits are operable without an external clock source, and inseparably share the tunable delay line.

2. The transceiver of claim 1, further comprising:
an auxiliary circuit coupled to the tunable delay line, and configured to delay the first modulated time signal without accumulating additional delay in the tunable delay line.

3. The transceiver of claim 2, wherein the auxiliary circuit comprises a logical gate configured to gate the first modulated time signal to combine the first modulated time signal for more than one cycle of the tunable delay line.

4. The transceiver of claim 1, wherein the modulation circuit is a Digital-to-Time Converter (DTC).

5. The transceiver of claim 1, wherein the demodulation circuit is a Time-to-Digital Converter (TDC).

6. The transceiver of claim 1, wherein the tunable delay line comprises a ring oscillator.

7. The transceiver of claim 1, further comprising:
a mode buffer coupled to an input of the demodulator circuit, and configured to enable the transceiver to operate in a modulation mode or a demodulation mode.

8. A circuit, comprising:
a first transceiver as claimed in claim 1;
a second transceiver as claimed in claim 1; and
an XOR gate comprises a first input coupled to an output of the modulator of the first transceiver, a second input coupled to an output of the modulator of the second transceiver, and configured to interleave the first modulated time signal of the first transceiver and the first modulated time signal of the second transceiver.

9. The transceiver of claim 1, wherein the modulation circuit is a Serial Time Encoded Phy (STEP) modulation circuit, and the demodulation circuit is a STEP demodulation circuit.

10. A circuit, comprising:
a first transceiver as claimed in claim 1;
a second transceiver as claimed in claim 1; and
a divider circuit comprising a first output coupled to an input of the demodulator of the first transceiver, and a second output coupled to an input of the demodulator of the second transceiver, and configured to divide a received modulated time signal into the second modulated time signal of the first transceiver and the second modulated time signal of the second transceiver.

11. The circuit of claim 10, wherein the first transceiver is configured to be synchronous with rising edges of the received modulated time signal, and the second transceiver is configured to be synchronous with falling edges of the received modulated time signal.

12. A transceiver, comprising:
a modulation circuit configured to modulate a first digital word into a first modulated time signal;
a tunable delay line comprising cascade-connected delay circuits formed in a ring,
wherein the modulation circuit is configured to modulate the first digital word into the corresponding first modulated time signal by enabling one of the cascade-connected delay circuits, and an input of the tunable delay line is a feedback signal from the enabled delay circuit; and
a demodulation circuit configured to demodulate a second modulated time signal into a second digital word,
wherein the modulation and demodulation circuits are operable without an external clock source, and inseparably share one or more same circuit elements.

13. A transceiving method, comprising:
modulating, by a modulation circuit, a first digital word into a first modulated time signal;
setting, by a tunable delay line, a time rate of the modulation; and
demodulating, by a demodulation circuit, a second modulated time signal into a second digital word,
wherein the modulation and demodulation circuits are operable without an external clock source, and inseparably share the tunable delay line.

14. The transceiving method of claim 13, further comprising:
delaying, by an auxiliary circuit coupled to the tunable delay line, the first modulated time signal without accumulating additional delay in the tunable delay line.

15. The transceiving method of claim 14, further comprising:
gating, by a logical gate of the auxiliary circuit, the first modulated time signal to combine the first modulated time signal for more than one cycle of the tunable delay line.

16. The transceiving method of claim 13, wherein the modulation circuit is a Digital-to-Time Converter (DTC).

17. The transceiving method of claim 13, wherein the demodulation circuit is a Time-to-Digital Converter (TDC).

18. The transceiving method of claim 13, wherein the tunable delay line comprises a ring oscillator.

19. The transceiving method of claim 13, further comprising:
enabling, by a mode buffer coupled to an input of the demodulator circuit, and the transceiver to operate in a modulation mode or a demodulation mode.

20. The transceiving method of claim 13, further comprising:
interleaving the first modulated time signal of a transceiver with another modulated time signal of another transceiver.

21. The transceiving method of claim 13, further comprising:
dividing a received modulated time signal into the second modulated time signal of a first transceiver and another modulated time signal of another transceiver.

22. A transceiving method 14, comprising:
modulating, by a modulation circuit, a first digital word into a corresponding first modulated time signal by enabling one of cascade-connected delay circuits connected in a ring to form a tunable delay line; and
feeding back from the enabled delay circuit a feedback signal as an input of the tunable delay line; and
demodulating, by a demodulation circuit, a second modulated time signal into a second digital word,
wherein the modulation and demodulation circuits are operable without an external dock scarce, and inseparably share one or more same circuit elements.

* * * * *